(12) United States Patent
McCrate et al.

(10) Patent No.: US 11,962,327 B2
(45) Date of Patent: Apr. 16, 2024

(54) ITERATIVE DECODING TECHNIQUE FOR CORRECTING DRAM DEVICE FAILURES

(71) Applicant: Micron Technology, Inc., Boise, ID (US)

(72) Inventors: Joseph M. McCrate, Boise, ID (US); Nevil Gajera, Boise, ID (US); Mohammed Ebrahim Hargan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/896,957

(22) Filed: Aug. 26, 2022

(65) Prior Publication Data

US 2023/0223960 A1     Jul. 13, 2023

Related U.S. Application Data

(60) Provisional application No. 63/299,394, filed on Jan. 13, 2022.

(51) Int. Cl.
*H03M 13/15*    (2006.01)
*H03M 13/37*    (2006.01)

(52) U.S. Cl.
CPC ..... *H03M 13/154* (2013.01); *H03M 13/1575* (2013.01); *H03M 13/153* (2013.01); *H03M 13/1545* (2013.01); *H03M 13/373* (2013.01); *H03M 13/3746* (2013.01)

(58) Field of Classification Search
CPC .................. H03M 13/373; H03M 13/3746
See application file for complete search history.

(56) References Cited

U.S. PATENT DOCUMENTS

| | | | |
|---|---|---|---|
| 9,166,623 B1 * | 10/2015 | Bates | H03M 13/1555 |
| 2018/0165151 A1 * | 6/2018 | Lee | G06F 11/1048 |
| 2022/0382631 A1 * | 12/2022 | Brewer | G06F 11/1076 |

\* cited by examiner

*Primary Examiner* — Thien Nguyen
(74) *Attorney, Agent, or Firm* — Wood IP LLC

(57) ABSTRACT

Provided is a memory system comprising a plurality of memory components; and a controller in communication with the plurality of memory components and configured to perform error correction code (ECC) decoding on a received word read from the plurality of memory components. The ECC decoding is configured to (i) detect one or more random errors in a portion of the received word, the portion corresponding to one of the components within the plurality, and (ii) correct the detected random errors; and when the correcting of the detected random errors fails, iteratively marking symbols in the remaining portions of the received word as erasures.

21 Claims, 9 Drawing Sheets

ITERATIVE DECODING TECHNIQUE FOR CORRECTING DRAM DEVICE FAILURES

CROSS-REFERENCE TO RELATED APPLICATIONS

This application claims benefit to U.S. Provisional Patent Application No. 63/299,394, filed on Jan. 13, 2022, the disclosure of which is incorporated herein in its entirety by reference.

FIELD OF TECHNOLOGY

The following relates generally to improving reliability, availability, and serviceability (RAS) in memory devices. In particular, the disclosure relates to improved error correction code (ECC) techniques for detecting and correcting errors due to memory device failures.

BACKGROUND

Memory devices (e.g., memory media devices) are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0.

In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic random access memory (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory cells may maintain their programmed states for the duration of the system being powered on. Non-volatile memory cells (e.g., Not And (NAND) memory cells) may maintain their programmed states for extended periods of time even in the absence of an external power source.

Many memory devices comprise multiple memory components. For example, a single read or write operation from a memory controller transfers data from or to multiple memory components in parallel. Thus, a single access may comprise data stored across multiple memory devices.

Compute express link (CXL) DRAM memory devices generally require high RAS. One key reliability consideration is achieving a low annualized failure rate (AFR) and silent data corruption (SDC) rate. As known in the art, SDC occurs when a processor inadvertently corrupts the data it processes but the rest of the system is unaware of the inadvertent corruption. Lower AFRs may be achieved using ECC techniques capable of detecting and correcting errors due to failure of an entire memory component. However, these techniques can be costly in terms of parity bit requirements. These techniques are commonly known to those of skill in the art as chipkill.

ECC techniques that cannot detect and correct an entire device failure (although rare) risk generating uncorrectable errors (UEs) when a single device fails. Other failure modes (e.g., single row failure) may corrupt all data in a single read access (pre-fetch) but data in most devices are still valid. ECC techniques that cannot detect and correct all bits in any given read from a single device are at risk for generating UEs from these failure modes. Access corrupting fail modes are believed to be more common than entire die fail modes and, therefore, represent the more likely reliability risk.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
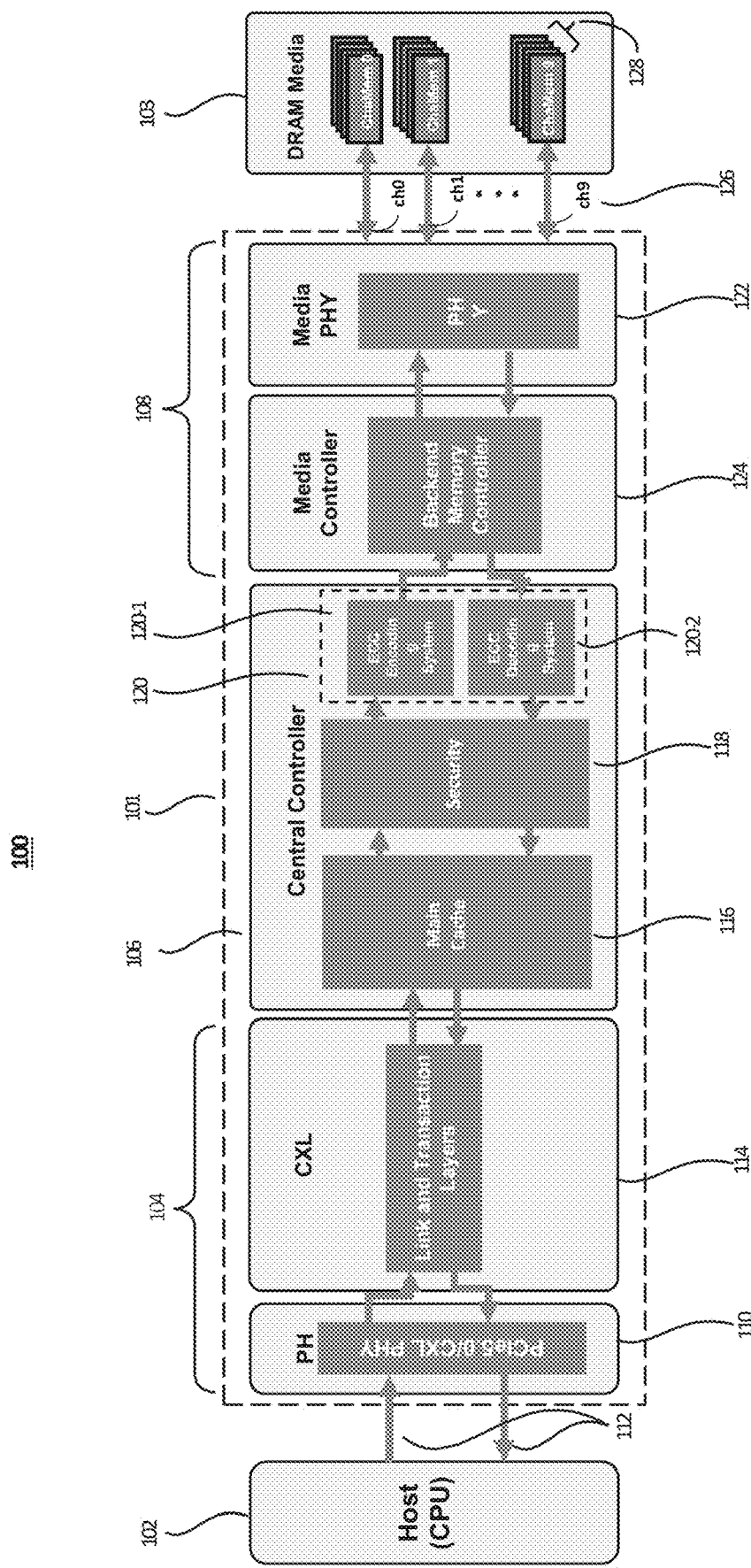
FIG. 1 illustrates a functional block diagram of a system including a host, a memory controller, and a memory array, according to an embodiment of the present disclosure.

FIG. 1 illustrates a functional block diagram of a system 100 including a host, a memory controller, and a memory array, according to an embodiment of the present disclosure. For example, the system 100 includes a memory controller 101 for managing transfer of data, commands, and/or instructions between a host 102 and a memory device, such as DRAM media 103.

The memory controller 101 includes a front end portion 104, a central controller 106, and a backend 108. By way of example, the host 102 can be a central processor unit (CPU), personal computer, mobile telephone, an Internet-of-Things (IoT) enabled device, or the like. The host 102 can include processing resources (e.g., one or more processors, microprocessors, or other type of controlling circuitry) capable of accessing the DRAM media 103.

The front end portion 104 may include a physical interface 110 to couple the memory controller 101 to the host 102 through input/output (I/O) lanes 112. Interface management circuitry 114 manages the interface 110. For example, the interface 110 can include suitable protocols (e.g., a data bus, an address bus, and a command bus, or a combined data/address/command bus). Such protocols may be custom or proprietary, or may be standardized, such as the peripheral component interconnect express (PCIe), CXL, Gen-Z, cache coherent interconnect for accelerators (CCIX), or the like.

The central controller 106 can control, in response to receiving a request from the host 102, performance of a memory operation, such as reading/writing data from/to the DRAM media 103. The central controller 106 can include a main cache 116 to store data associated with performance of memory operation, and/or a security component 118 to encrypt the data before storage in the DRAM media 103.

The central controller 106 includes an ECC controller 120 to detect and correct n-bit errors that may occur in the data stored in the DRAM media 103. The ECC controller 120 includes an ECC encoding system 120-1 and an ECC decoding system 120-2. The ECC encoding system 120-1 executes encoding operations to encode the data written to the DRAM media 103. The ECC decoding system 120-2 executes decoding operations to decode the data read from the DRAM media 103.

Users are increasingly requiring that certain DRAM products have higher reliability so that a host, such as the host 102, can successfully retrieve the stored data. ECC techniques, such as chipkill noted above, are implemented to increase DRAM reliability. ECC chipkill protects data against any single DRAM component failure. As an example, ECC may require additional parity bits to be stored, in addition to original user data bits. The need to store additional ECC parity bits, however, reduces the media capacity available to the host 102, increases overall costs, and increases power usage.

By way of background, a competing requirement is the ability to store other information, in addition to the ECC parity bits, on top of the original user data. CXL products, for example, are required to store metadata in certain circumstances. Thus, the need to store metadata conflicts with the need to store the additional ECC parity bits. Therefore, less costly ECC solutions (in terms of parity and die overhead) are needed to correct errors when an entire device fails or an entire read access to a device is corrupt.

An optimal ECC solution, in accordance with the embodiments, leverages (i) the ability to correct more erasures than random errors and (ii) the fact that most errors will likely be confined to a specific DRAM component. Stated another way, the odds of multiple DRAM components failing simultaneously is very low. Additionally, if the failure is a UE, determined via an ECC algorithm, then it is also likely the fault generating the UE is bounded to one faulty DRAM component.

ECC schemes capable of correcting errors using parity symbols, such as RS codes, are well known to those of skill in the art. By way of background, RS codes include a group of error-correcting codes that operate on a linear block of data called codewords. Codewords are of (n) length and include (k) data symbols, along with parity check symbols added to the data symbols, each symbol comprising (s) bits. There are (n)-(k) parity symbols. The parity check symbols enable RS codes to detect and correct multiple symbol errors.

For example, using 2(t) parity symbols, RS codes can correct combinations of erasures (v) and random errors (e) such that $(v)+[(e)/2] \leq (t)$. Additionally, a codeword may span (j) devices, with (x) symbols per device such that the entire codeword $(n)=(x)*(j)$ symbols.

As used herein, an erasure means that a specific symbol location for one or more bits is known to be corrupt (i.e., unknown error value). The location of a random error is unknown. All that is known is that data corruption occurred. As a result, if the location of the error is known, it is possible to correct more erasures than random errors. In fact, consistent with the expression above, twice as many erasures (v) can be corrected as random errors (e). More specifically, an RS based decoder can correct up to (t) errors or up to 2(t) erasures.

Conventional ECC schemes are generally unable to efficiently detect and correct failures in certain circumstances. Included in these circumstances are cases where an entire device fails and/or cases involving all bits in a given read from a single device. These circumstances are exacerbated when the ECC scheme is constrained to (e) errors being treated as random errors (i.e., no erasure information). These constraints cause the decoder to either indicate a failure or correct to the wrong codeword, resulting in SDC. ECC solutions constructed in accordance with the embodiments, however, remedy this deficiency.

In the embodiments of the present disclosure, knowledge of erasure location is leveraged to identify a single faulty DRAM component based on other DRAM component(s) that were successfully decoded. Also, knowledge that faults leading to the corruption of multiple symbols in a codeword are likely confined to a single DRAM component significantly reduces the search space (i.e., possible error location combinations) required to identify the error location, compared to other ECC techniques. ECC solutions, in accordance with the embodiments, also decrease decoding delays and reduce the occurrence of false decoding errors.

Returning to FIG. 1, DRAM devices, such as the DRAM media 103, usually consist of identical DRAM components. Data may be stored to, and accessed from, multiple components in parallel. In these arrangements, the failure of any one component may corrupt data and result in errors. The ECC controller 120 implements an iterative decoding technique that corrects DRAM device failures and ultimately reduces the likelihood of such errors.

Using exemplary RS coding principles, the ECC encoding system 120-1 stores original user data (e.g., data bits) in memory in the form of a linear block code, known as a codeword. The codeword includes the original payload or user data bits, along with a set of ECC parity bits used to check for errors in the data bits. The host 102 may later request the memory controller 101 to retrieve the stored user data. In response, the ECC decoding system 120-2 reads the codeword from the DRAM media 103, decodes the codeword to correct any errors, and provides decoded data bits to the host 102.

The backend 108 may include multiple physical layer (PHY) 122 and a media controller 124 to drive an interface 126. The interface 126 couples the memory controller 101 to channel memory devices (ChaMem0-ChaMem9) within the DRAM media 103. By way of example only. and not limitation, the interface 126 includes data/parity channels (ch0-ch9) respectively corresponding to the channel memory devices (ChaMem0-ChaMem9). In one or more embodiments, the channels (ch0-ch9) may include low-power double data rate 5 (LP5) channels.

The channel memory devices (ChaMem0-ChaMem9) may be arranged in a plurality layers of memory regions forming logical memory ranks 128, each rank including one or more die (i.e., components) therein. As understood by those of skill in the art, a memory rank includes a set of DRAM chips that can be accessed simultaneously via a common chip select.

Figure 2:
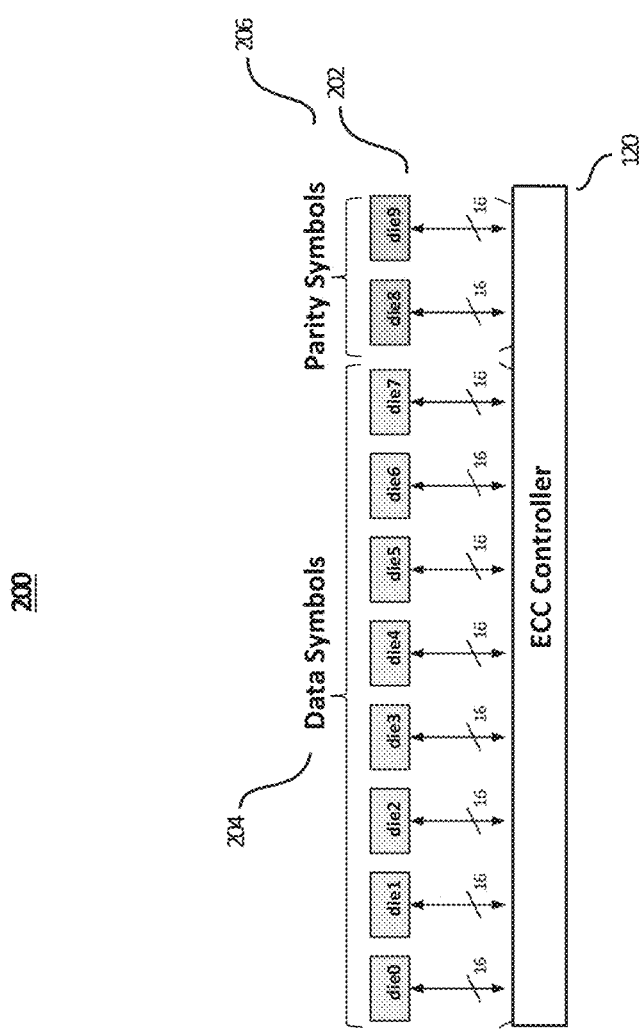
FIG. 2 illustrates an example of how symbols from a single Reed-Solomon (RS) codeword may be distributed across a plurality of DRAM devices in accordance with the embodiments.

FIG. 2 illustrates an exemplary scheme 200 of the data and parity channels (ch0-ch9) 126 depicted in FIG. 1. Specifically, FIG. 2 illustrates DRAM memory device components 202 (die0-die9) within the channel memory devices (ChaMem0-ChaMem9), respectively. The DRAM device components (die0-die9) 202 represent one of the memory ranks 128 and are electrically coupled, at least indirectly, to the ECC controller 120. In FIG. 2 where (n) equals 44, one ECC codeword includes data from each of the DRAM device components (die0-die9) 202.

In the scheme 200, a respective portion of the ECC codeword is stored in each of the device components (die0-die9) 202. For example, eight device components (die0-die7) contain data symbols 204 and the remaining three device components (die8-die9) contain parity symbols 206. In the example of FIG. 2, each of the device components (die0-die9) 202 contributes (4) symbol bits 304 to the ECC codeword, illustrated in greater detail in FIG. 3.

Figure 3:
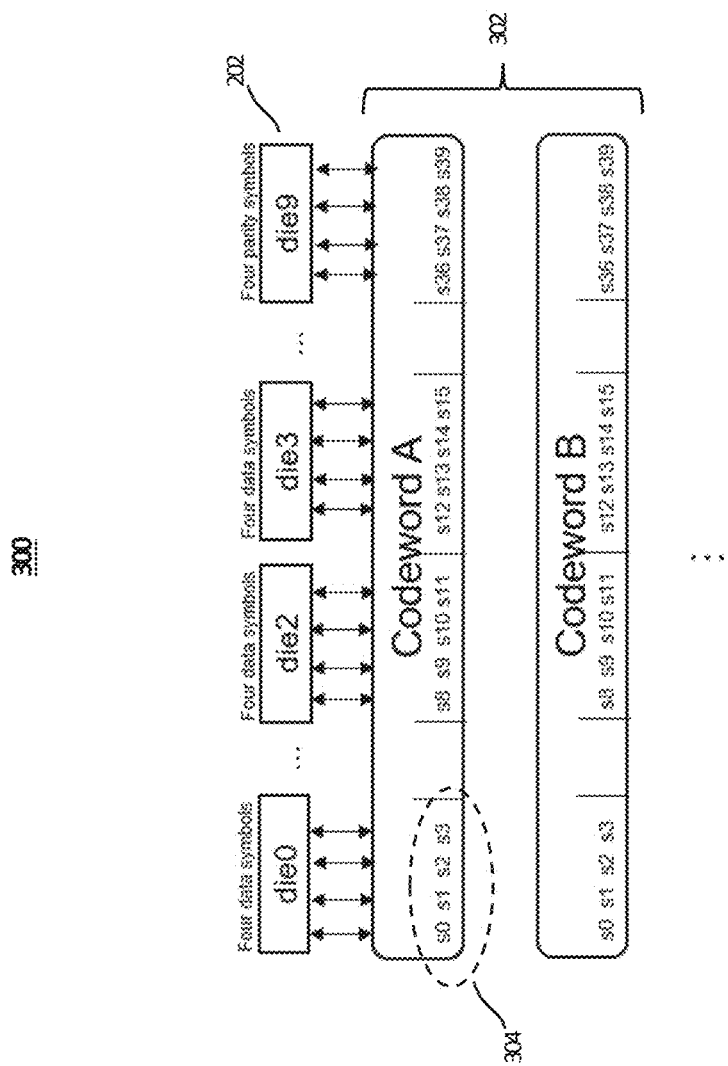
FIG. 3 illustrates exemplary data and parity channels within the computing system depicted in FIG. 1.

FIG. 3 is an illustration of an exemplary construction 300 depicting a relationship between the ECC codeword symbols with the data/parity channels (ch0-ch9). In FIG. 3, each of exemplary ECC codewords 302 (e.g., codewords A-B) includes four symbol bits from each of the device components (die0-die9) 202. That is, each of the ECC codewords A-B includes 10 symbols (40 bits total): 4 bits from each of the device components (die0-die9) 202.

By way of example, codeword A includes data bits (32 total) and parity bits (8 total) from each of the device components (die0-die9) 202. That is, codeword A is comprised of data symbols s0-s31 and parity symbols s32-s39. The data symbols s0-s31 and parity symbols s32-s39 correspond to the device components (die0-die9) 202, respectively. From a different point of view, data symbols s0-s3, in each of the ECC codewords 302, is associated with the device component die0.

In the embodiments, as illustrated in FIGS. 2-3, if (t)<(x)≤2(t), the codeword can be successfully decoded if the (x) symbols are correctly identified as erasures. This approach requires knowledge of the erasure locations prior to decoding. Also, erasure corrections generally require an error-and-erasure decoding algorithm (a modified version of an error decoding algorithm).

During operation, the ECC controller 120 can essentially guess the corresponding component in which a failure occurred and process the results in the ECC decoding system 120-2 to determine which failures were successfully decoded. This knowledge (i.e., that fails are most likely confined to a specific DRAM component) can be used to reduce the search space and complexity of the decoder (e.g., the ECC decoding system 120-2) needed to decode the codewords 302.

One advantage of the ECC decoding system 120-2, in comparison to conventional ECC decoding systems, is illustrated in an example of where 2(t)=6 and (x)=4 (e.g., FIGS. 2-3B). In this example, up to (3) random symbol errors can be corrected, while up to (6) erasures can be corrected. In conventional ECC decoding systems, an entire die failure, or a single read access failure on one device, cannot be corrected. These failures will result in UEs. The ECC decoding system 120-2, however, leverages information not used in the conventional ECC decoding systems: if the decoding fails (i.e., more than 3 symbols are corrupted) then the most likely suspect is that all symbols from a single device have been corrupted.

In the embodiments, this information can be used to implement the iterative ECC decoding solution, described herein. This iterative ECC decoding strategy marks symbols from one of the device components (die0-die9) 202 as erasures and then attempts to decode the resulting codeword.

Using the exemplary ECC decoding system 120-2, if the data from a selected one of the device components (die0-die9) was corrupt (and remaining components had no errors) then the process will successfully correct the erasures and return the codeword. If decoding fails, the process iterates to the next one of the device components (die0-die9), marks its symbol bits as erasures (previous component symbol bits are restored) and attempts decoding. This process continues until all of the device components (die0-die9) have been checked as erasures. If no successes were found, the ECC controller 120 returns an uncorrectable error (UE) to the host 102.

As background, ECC decoding algorithms exist that can correct both random errors and erasures. As used herein, an error is corruption of part of the data due to some underlying mechanism (or fault). Errors cannot be controlled and, a priori, their location in the data is unknown. By contrast, an erasure can be controlled (e.g., within the decoder). For decoding purposes, a symbol is identified as erased if that symbol is suspected of being corrupt.

Certain decoders (e.g., error and erasure decoders) can use this information to more efficiently correct the received codeword, assuming the correct symbols were identified as being corrupt. The efficiency gain is because for random errors, the decoder must determine both the location and the correct value of any errors. For erasures, however, the decoder only needs to determine the correct value for those symbols. The decision of whether to mark a symbol as erased is determined by the decoding algorithm, while the error locations are due to random events occurring in the media, such as the DRAM media 103.

In some technologies, it is possible to identify data that should be treated as erased. For example, in analog communications if data is expected to correspond to −1 volt (V) or +1V, but 0V is measured, it is reasonable to infer that the true value of that bit is unknown. Consequently, that bit may be marked as erased for decoding purposes. However, digital communications use DRAM devices that process digital signals (0V or 1V). Therefore, in this example, a reasonable inference cannot be drawn from the measurement itself as to whether the bit has been corrupted.

In general, it is possible to guess which symbols are corrupt and mark those symbols as erasures for decoding purposes. However, the search space is generally too large to efficiently perform such a strategy. As an example, there are over one million ways to choose 4 symbols out of 72. The embodiments leverage these aspects of erasure decoding and memory faults. More specifically, the embodiments leverage the knowledge that faults generating errors in a given codeword are generally contained within a single DRAM component. For an example, the iterative ECC solution described herein can reduce the search space from (72,4)>1 million to (10,1)=18.

Figure 4A:
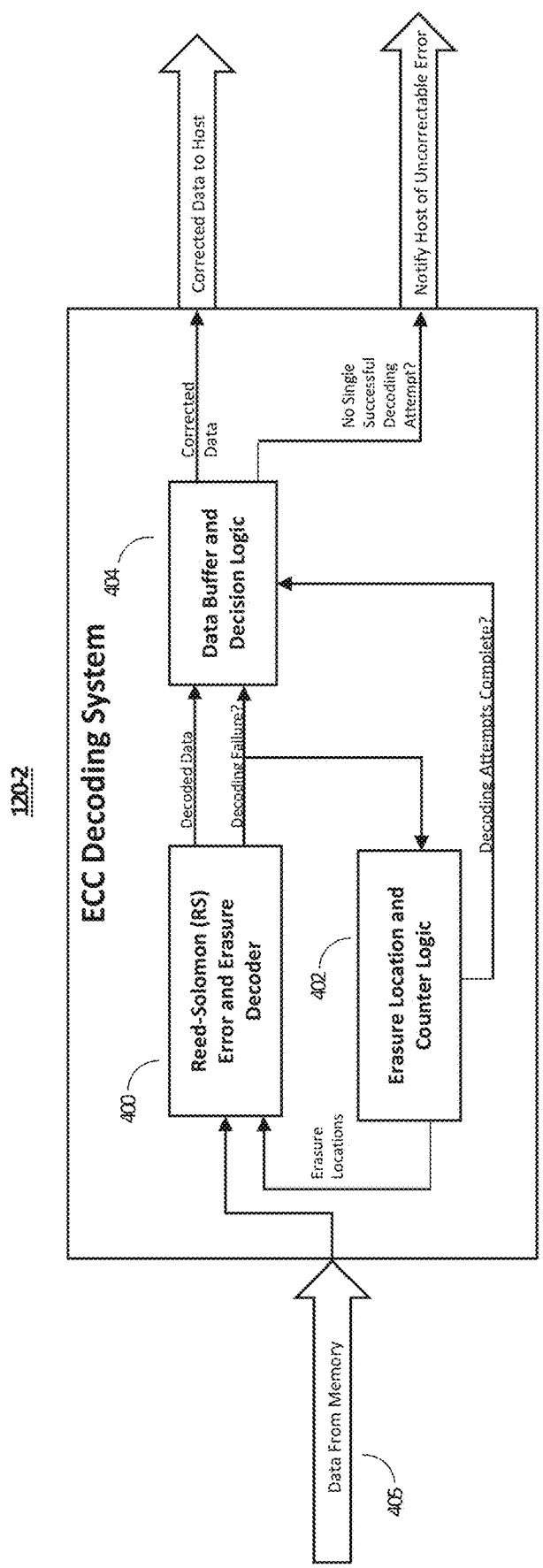
FIG. 4A is a more detailed illustration of the exemplary ECC decoding system depicted in the system of FIG. 1.

FIG. 4A is a detailed illustration of the exemplary ECC decoding system 120-2 of FIG. 1, in accordance with the embodiments. The ECC decoding system 120-2 includes an RS error and erasure decoder 400, erasure location and counter logic 402, and data buffer and decision logic 404 for sequentially performing decoding operations (e.g., attempts). The ECC decoding system 120-2 attempts to decode input data 405, corresponding to the codeword A above, received from memory, such as the DRAM media 103.

During an example operation, an initial single attempt, that does not mark any symbols as erasures, is made to decode the data 405. The result of this attempt is output from the RS error and erasure decoder 400 for storage in the data buffer and decision logic 404. If this single attempt to decode the data 405 is successful, the corrected data, stored in the data buffer and decision logic 404, will be returned to the host 102.

If this initial attempt to decode fails, multiple decoding attempts will be performed, with each attempt marking all the symbols that correspond to a single DRAM component (e.g., die0) as erased. These results are input to the erasure location and counter logic 402, where erasure location information is obtained and fed back to the RS error and erasure decoder 400. Some embodiments of the ECC decoding system 120-2 include an erasure pointer for storing the location of an erasure and supplying the location to a syndrome decoder. Other embodiments include a pointer for tracking the symbols (corresponding to DRAM components) where erasure attempts have been performed.

The corrections from the multiple decoding attempts (i.e., the successfully decoded data) are stored in the data buffer and decision logic 404. If no single decoding attempt was successful, after all the decoding attempts have been completed, the host 102 is notified of a UE. In some embodiments, an optional error detection block (e.g., CRC) may be included between the RS erasure and decoder block 400 and the data buffer and decision logic 404. The output of this optional block is a signal indicating a decoding failure.

Figure 4B:
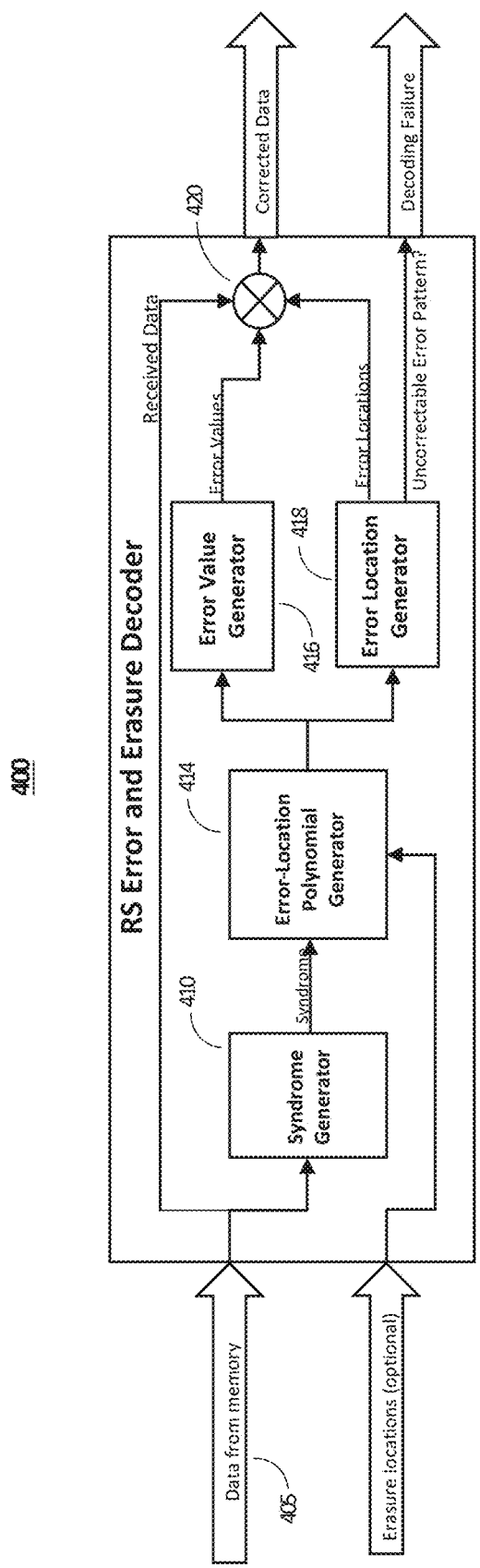
FIG. 4B is a more detailed block diagram illustration of the ECC decoding system of FIG. 4A.

FIG. 4B is a more detailed block diagram illustration of the RS error and erasure decoder 400 in the ECC decoding system 120-2 of FIG. 4A. The ECC decoder 400 includes a syndrome generator 410 that receives data 405 from the memory, representative of the codeword A.

A non-zero syndrome value indicates an error in the received word. The syndrome vector is an intermediate error correction step for identifying the location of a single error in the codeword. The syndrome and erasure calculation values are supplied to error location polynomial generator 414.

In the embodiments, the error location polynomial generator 414 calculates erasure locator polynomials and error-evaluator polynomials. The erasure locator polynomials accumulate information about possible erasures for later use within the ECC decoding system 120-2. Specifically, the polynomial generator 414 derives polynomial error locations and evaluates error/erasure values using the erasure locator polynomials. The error-evaluator polynomials quantify the magnitude of the errors at any and each error/erasure location.

In one exemplary embodiment, the polynomial generator 414 calculates error-evaluator polynomials based upon Berlekamp iterative algorithm principles. The Berlekamp algorithm is one exemplary approach for solving a series of functions to generate the error location polynomials over finite fields. Detailed operation of the Berlekamp algorithm is well known to those of skill in the art. Accordingly, detailed operation of the Berlekamp algorithm will not be provided herein. Other approaches for deriving the error location polynomials, such as Euclid's algorithms, are known and are within the spirit and scope of the embodiments. The polynomial generator 414 sends the error location and error/erasure value polynomials to error value generator 416 and error location generator 418.

The error value generator 416 calculates or confirms the error values at known error locations based upon the error-evaluator polynomials output from the polynomial generator 414. By way of example only, and not limitation, one approach for calculating the error values is based on the Forney algorithm. General operation of the Forney algorithm is also well known to those of skill in the art. Accordingly, details of the Forney algorithm will not be provided herein.

The error location generator 418 conducts a search of possible error location combinations to find an error evaluation value that confirms the location of specific errors. In one embodiment, the error location generator 418 implements a Chien search scheme to conduct the search of the possible error locations. A mixer 420 correlates error values and error locations, respectively output from the error value generator 416 and the error location generator 418, with the received data 405 from the memory. An output from the mixer 420, in the form of corrected data, is provided to the host 102. If the search fails, the RS decoder 400 declares a decoding failure and the host 102 is notified of a UE.

Figure 5:
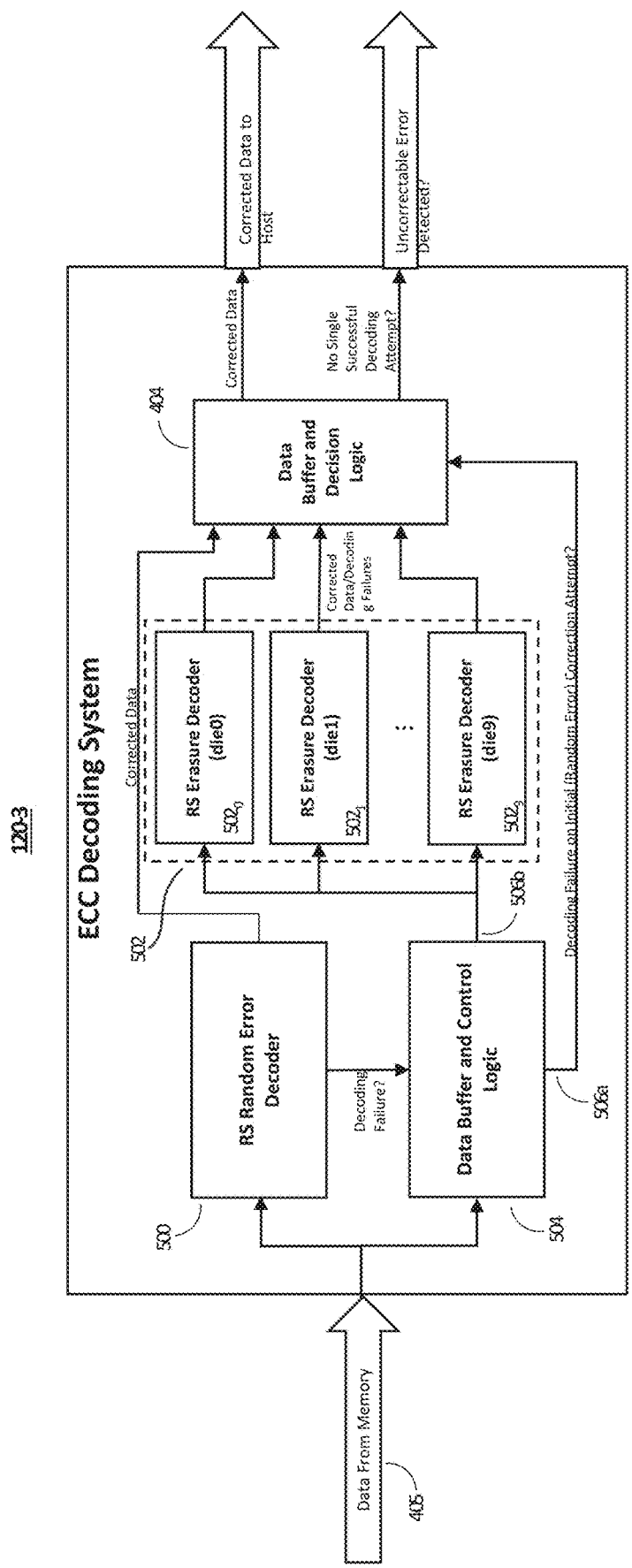
FIG. 5 is a block diagram illustration of an alternative implementation of the ECC decoding system of FIG. 1.

FIG. 5 is a block diagram illustration of an ECC decoding system 120-3, in an alternative embodiment of the present disclosure. The ECC decoding system 120-3 performs decoding attempts in parallel instead of sequentially, as performed in the ECC decoding system 120-2. The ECC decoding system 120-2b includes RS random error decoder 500, RS erasure decoder module 502, and data buffer and control logic 504. The ECC decoding system 120-3 may also include the data buffer and decision logic 404, discussed above in relation to the ECC decoding system 120-2.

The RS random error decoder 500, which could be a standard RS decoder, is configured to correct random errors in the data 405 received from memory, such as the DRAM media 103. By way of example, the decoder 500 performs an initial decoding attempt to correct any random errors. If the initial decoding attempt is successful, the decoding process continues and corrected data, resulting from the initial decoding attempt, is provided to the data buffer and decision logic 404. This corrected data is returned to the host 102.

If the initial decoding attempt is unsuccessful, the resulting data (from the failed initial decoding attempt) follows two separate paths, 506a and 506b, substantially simultaneously. Along the first path 506a, the failed data is provided to the data buffer and decision logic 404 for storage. Upon satisfaction of an error count threshold, the failed data is output from the data buffer and decision logic 404 and returned to the host 102 as a UE.

Along the second path 506b, the data from the failed attempt is sent to the RS erasure decoder module 502 where attempts will be made to correct as an erasure. The RS erasure decoder module 502 includes a plurality of RS erasure-only decoders $502_0$-$502_9$, each corresponding to one of DRAM device components (die0-die9). Although 11 RS erasure decoders ($502_0$-$502_9$) are illustrated in FIG. 5, and practice, any number of RS erasure decoders ($502_0$-$502_N$) could be used. The multiple RS decoders ($502_0$-$502_9$) enables simultaneous decoding attempts.

The erasure only decoders $502_0$-$502_9$ are less complex and have a smaller footprint (i.e., required silicon area) in comparison to conventional RS decoders. One reason for the reduced footprint and complexity is because erasure only decoders, such as the erasure decoders $502_0$-$502_9$, do not calculate the error-evaluator polynomials, discussed above in relation to the RS error and erasure decoder 400. Erasure only decoders, however, must still calculate the error values.

FIGS. 5 and FIG. 4A represents two extremes of completely serial and completely parallel erasure decoding. For reasons including power, performance, and cost optimization, a compromise between these extreme may be implemented in the embodiments. In this compromise, there could be more than one, but less than N, decoder instances on the controller.

Figure 6:
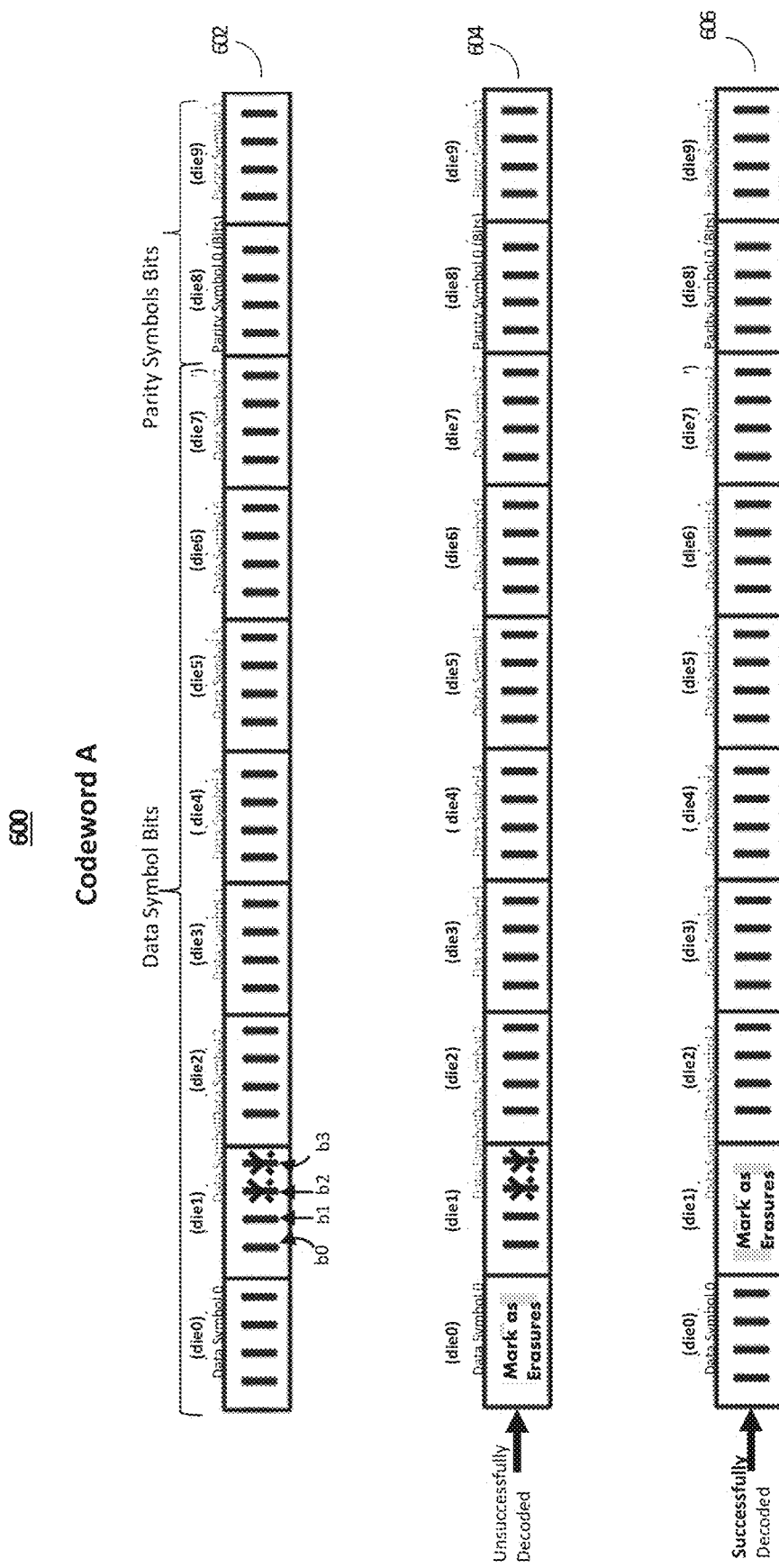
FIG. 6 illustrates a correlation between codeword symbol bits and the memory device components depicted in the system of FIG. 2.

FIG. 6 illustrates an example 600 of decoding symbols in one codeword (e.g., codeword A), consistent with the information discussed above. In FIG. 6, the codeword A includes portions, each corresponding to one of the DRAM device components (die0-die9). In the example of FIG. 6, assume the input codeword A, in a first depiction 602, includes four symbol bits (b0-b3), from data symbol 1, stored in DRAM device component die1.

In the first depiction 602, the symbol bits b2, b3 represent the location of the actual fails, or erasures (i.e., bits are known to be bad). However, the specific location of these actual erasures is unknown to the RS error and erasure decoder 400. To locate and correctly decode these erasures or fails, the RS error and erasure decoder 400 will conduct a search of memory space within the DRAM device components (die0-die9) corresponding to the symbols in codeword A, depicted in FIG. 6.

To conduct the search, the RS error and erasure decoder 400 will mark as erasures, and attempt to decode, all of the symbols in each of the DRAM device components (die0-die9). This process of marking and decoding is performed in an iterative manner (i.e., one die at a time). More specifically, the RS error and erasure decoder 400 will mark all of the symbols in a first of the DRAM device components (die0-die9) as erasures, and then attempt decode the marked bits as erasures.

A successful decoding attempt of only one of the die (die0-die9) means that the successfully decoded die represents the location of the actual fails, or erasures. That is, after all of the DRAM device components (die0-die9) have been searched, and if only one single die has been successfully decoded, then codeword A may be declared as successfully decoded. Correspondingly, the correct decoded values of the codeword A will be returned to the host 102. An example of this process is depicted in decoding attempts 604 and 606 of FIG. 6.

In a first decoding attempt 604 of the codeword A, the symbols (i.e., bits) in die0, corresponding to data symbol 0, are marked as erasures. The RS error and erasure decoder 400 will then attempt to decode the marked die0 bits as erasures. Since the actual erased symbol bits (b2, b3) are located in die1 (as noted above), the decoding attempt 604 (i.e., decoding die0 symbol bits as erasures) will likely fail. That is, the die0 symbol bits will likely be unsuccessfully decoded in the decoding attempt 604.

In a second decoding attempt 606 of the codeword A, the symbol bits of die1, corresponding to data symbol 1, are marked as erasures. The RS error and erasure decoder 400 will then attempt to decode the marked die1 symbol bits as erasures. In this case, since the actual erased symbol bits (b2, b3) are contained in die1, the decoding attempt 606 will likely succeed, meaning the die1 symbol bits will be successfully decoded. Each successful decoding attempt increments an attempts counter (not shown). As the search continues, this process (i.e., marking the symbol bits as erasures and attempting to decode) is repeated in all of the remaining die (die2-die9).

After the search has concluded, the successful attempts counter is examined to determine whether more than one successful decoding attempt occurred. If only one successful decoding attempt occurred, a decoded (i.e., corrected) codeword A is returned to the host 102. A single successful decoding attempt is indicative of correctly locating the actual erasures.

Due to mis-corrections, for example, a small probability exists that multiple successful decoding attempts could occur during the search process. If multiple successful decoding attempts occurred in the example of FIG. 6, the RS error and erasure decoder 400 would have deemed the actual erased symbol bits (b2, b3) as being uncorrectable. Correspondingly, a UE would have been returned to the host 102. A similar probability exists that multiple die could have failed (though unlikely within the same codeword), that would theoretically result in zero successful decoding attempts. Zero successful decoding attempts would also result in a UE being returned to the host 102.

Figure 7A:
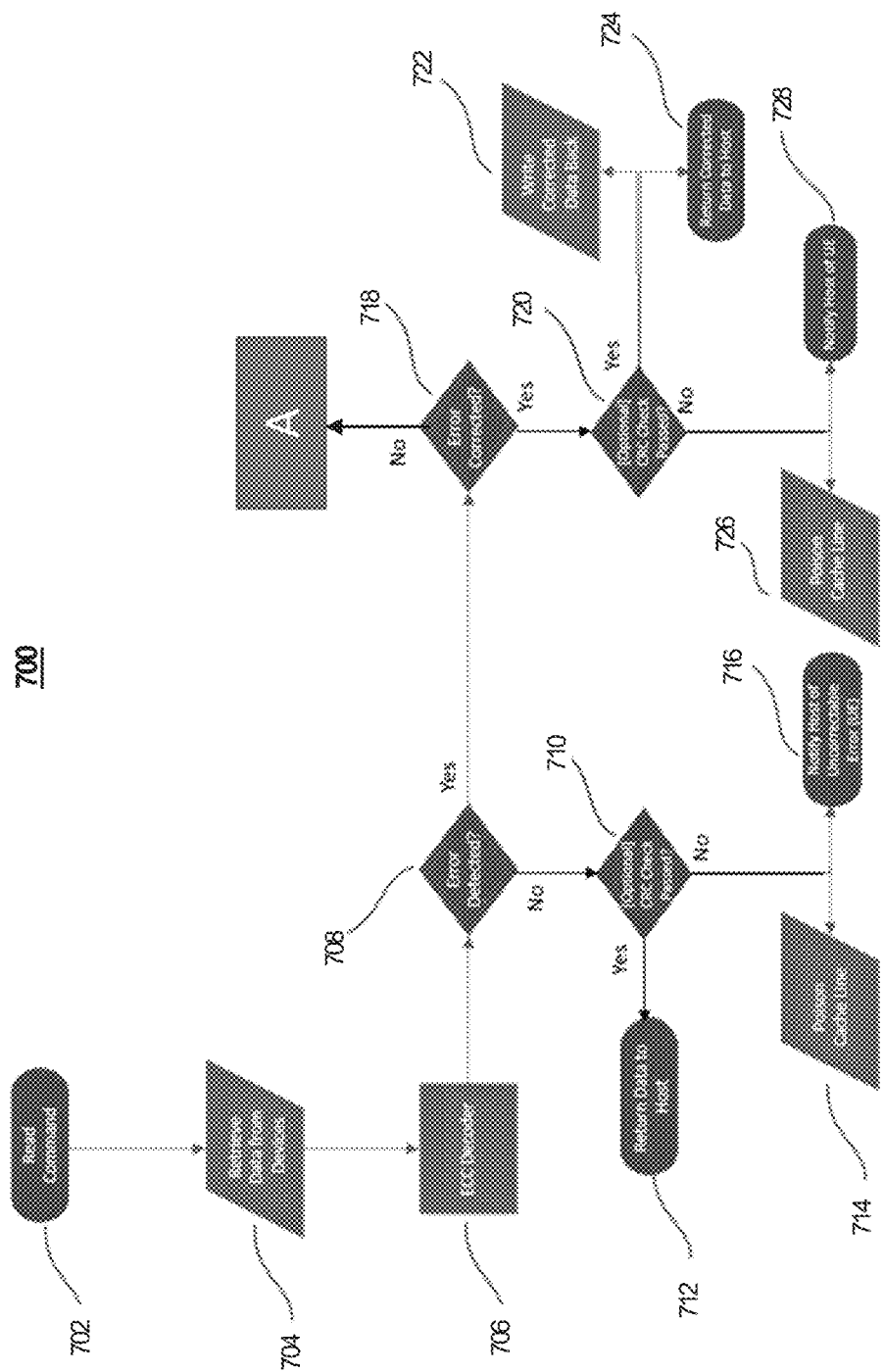
FIG. 7A is a flow chart of stage 1 of an exemplary iterative decoding and correcting method in accordance with the embodiments.

FIG. 7A is a flow chart of an exemplary iterative decoding and correcting method 700, in accordance with the embodiments. At a high-level, the method 700 initially follows a typical error response flow until a codeword cannot be successfully corrected. When the codeword cannot be successfully corrected, the iterative error and erasure decoding process, described above, is performed. Within this iterative process, some or all symbols in the DRAM device component (e.g., die0-die9) that triggered the error are marked as erasures, and decoding attempts are performed. Successfully decoded symbols (i.e., messages) may be further checked using cyclic redundancy check (CRC). Successful messages are later stored.

The method 700 begins at block 702 by executing a read command and retrieving data from memory device components within the DRAM media 103 (e.g., component die0) at block 704. At block 706, the data is provided to the ECC decoding system 120-2.

If no errors were detected at decision block 708, or if the conventional ECC decoder successfully decodes the data (with or without correction), a resulting message (i.e., the codeword with ECC parity bits removed) may be optionally checked using CRC checksums to prevent SDC. If the CRC is passed, the successfully checked data is returned to the host 102 at block 712. If the CRC fails, the data is marked as corrupt, the cache line (not shown) is poisoned at block 714, and the host 102 is notified of a UE at block 716. The poison cache line is used to mark and store data known to be corrupt, which serves as a flag to the host 102 (or some other process) that this data is problematic.

If an error is detected at block 708, the ECC error and erasure decoder 400 will attempt to correct the errors at block 718. To detect whether errors are present, a syndrome of all possible correctable errors will be calculated. Depending on the type of codeword (e.g., binary, q-ary, etc.), there are various ways known in the art to correct detected errors. If the detected error is corrected, a CRC may optionally be performed at block 720. If the CRC is successful, the corrected data is written back to the DRAM media 103 at block 722 and returned to the host 102 at block 724.

If the CRC is not corrected, the cache line is poisoned at block 726 and the host 102 is notified of a UE at block 728. If the error is not corrected at block 718, the method 700 activates an iterative error and erasure decoding process 730, beginning at block 732 in FIG. 7B.

In the embodiments, the initial decoding attempt does not use any erasures. The initial decoding attempt is based on random error correction only. If that attempt fails, the decoder subsequently begin searching for the "bad" DRAM component that represents the source of corrupt data in the codeword. During this search, as described above and in detail below, erasure decoding is used. That is, all the symbols from one DRAM device are marked as erasures and an attempt is made to correct the erasures. If the attempt is unsuccessful, a UE is returned to the host. A UE would most likely occur only if the error pattern was not contained within a single DRAM component.

Figure 7B:
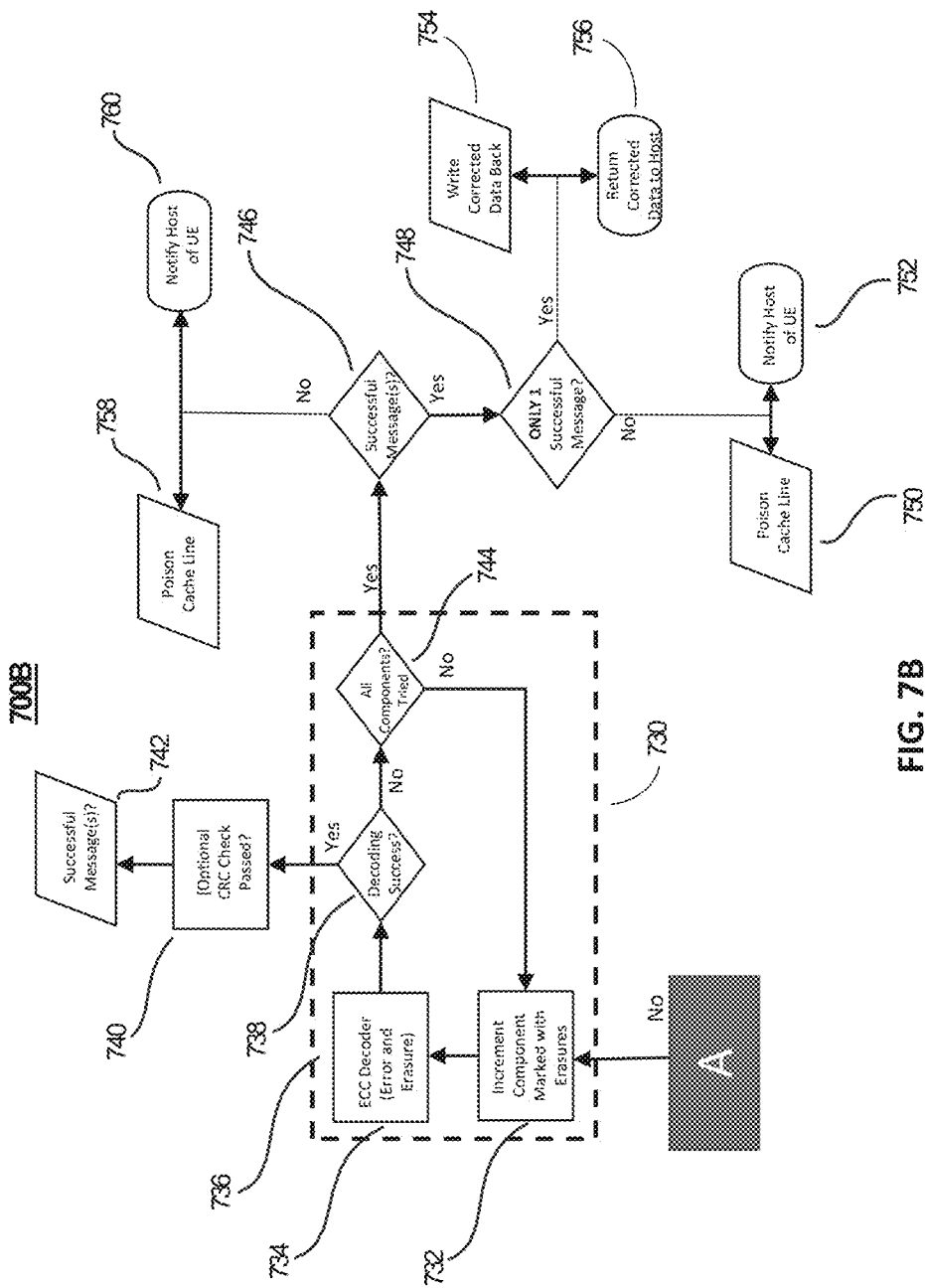
FIG. 7B is a flow chart of stage 2 of the exemplary iterative decoding and correcting method depicted in FIG. 7A.

In block 732 of FIG. 7B, if the error was not corrected at decision block 718, some or all the remaining bits in the symbol, associated with the corresponding component (e.g., component die0), are marked as erasures. After all the bits are marked as erasures, the ECC decoding system 120-2 increments and symbol bits within the next component (e.g., die1) are processed within the ECC error and erasure decoder 400 at block 734.

If the decoding was successful at block 738, a CRC may optionally be performed at block 740 and successful messages are stored at block 742. A check is made a block 744 to determine whether this iterative process (blocks 732-742) has been applied to all the DRAM device components (die0-die9) within a read cycle. If all the DRAM device components (die0-die9) have been tried, and the decoding process 730 is complete, a successful message queue (not shown) is checked to verify decoding of a successful message at block 746. If a successful message was decoded, a further check confirms that only one successful message was decoded at block 748.

In FIG. 7B, the iterative error and erasure decoding process 730 is performed on the components (die0-die9) in a serial fashion. Other embodiments may execute the decoding process 730 on all of the components (die0-die9) in parallel (see FIG. 5), or some combination thereof, to further reduce the decoding time.

In the embodiments, correcting errors as erasures introduces a slight possibility that another one of the components (e.g., die5) could have included additional errors that now mistakenly appear to be corrected. In another unlikely example, multiple components might fail simultaneously. If an additional component failed, this additional failure may incorrectly appear as another successful correction. Therefore, if the successful message queue contains more than one successful message at block 748, the cache line is poisoned at block 750 and the host 102 is notified of a UE at block 752.

If the successful message queue only contains one successful message at block 748, the corrected data is written back to the DRAM media 103 at block 754 and returned to the host 102 at block 756. Returning to block 746, if no successful messages were decoded at block 746, the cache line is poisoned at block 758 and the host 102 is notified of a UE at block 760.

Specifically, the embodiments leverage knowledge that faults corrupting multiple bits are most likely to be found or contained in one device component. In these circumstances, the disclosed embodiments succeed as long as the relationship holds where the ECC decoding system 120-2 can correct more erasures than errors. That is, the ECC decoding system 120-2 can correct up to (t) errors or 2(t) erasures. As a result, the disclosed embodiments are more efficient in facilitating a trade-off between parity symbols in the metadata, noted earlier.

Embodiments of the present disclosure include features analogous to generalized minimum distance (GMD) decoding. As understood by those of skill in the art, GMD is a method by which soft-decision decoding can be achieved using a combination of some reliability metric for each received bit or symbol and an error-and-erasure hard-decision decoder. The general idea is to sort the received bits or symbols according to their reliability, which is a quantity describing the relative probability of an error for the given bit or symbol, and attempt error-and-erasure decoding on combinations of the least reliable bits or symbols.

The reliability is determined based on characteristics of the channel. For example, a bit may be transmitted by modulating a signal where a positive value represents 0 and a negative value represents 1. A typical hard-decision decoder would only use the sign of the received signal for a given bit when decoding. However, a soft-decision decoder could use the magnitude of the received signal to indicate the reliability of the bit. The bits with magnitude closest to zero would be considered the least reliable and the decoding algorithm would attempt to decode with at least some of these bits as erasures.

In the embodiments of the present disclosure, it is not possible to gauge the reliability of bits or symbols based an analog signal since the output of the memory devices are digital values. Instead, the various methods define a search space based on knowledge of which bits or symbols were stored on a given memory device (e.g., die). Multiple symbol errors in a codeword are likely to be the result of a fault on a single memory device. Therefore, an exhaustive search is performed where all symbols from one component in the codeword, in an iterative fashion, are marked as erased and a decoding attempt is performed with an error-and-erasure decoder. If only one attempt succeeds, then the corrected data from this attempt is returned to the host. Otherwise, the decoding fails, and the host is notified of a UE.

The embodiments provide methods and systems that require less die overhead to correct errors that would otherwise be uncorrectable. This enables improved RAS for nominally the same cost. The embodiments specifically target the failure modes that are most likely to cause uncorrectable errors in the field.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:
1. A memory system comprising:
a plurality of memory components; and
a controller in communication with the plurality of memory components and configured to:
perform error correction code (ECC) decoding on a received word read from the plurality of memory components
comprising:
(i) performing a single decoding attempt to detect one or more random errors in a portion of the received word, the portion corresponding to one memory component within the plurality of memory components, and correct the detected random errors; and

(ii) when the correcting of the detected random errors fails, iteratively performing decoding attempts with each attempt marking symbols in the remaining portions of the received word that correspond respectively to remaining memory components of the plurality of memory components, as erasures, and using counter logic to obtain erasure location information corresponding to the erasures.

2. The memory system of claim 1, wherein the random errors include at least one of bit and symbol errors.

3. The memory system of claim 2, wherein the marking facilitates correcting the symbols in the remaining portions of the received word.

4. The memory system of claim 1, wherein the plurality of memory components includes dynamic random access memory (DRAM) devices.

5. The memory system of claim 4, wherein the memory system is constructed in accordance compute express link (CXL) principles.

6. The memory system of claim 1, wherein the ECC decoding is performed in each attempt in accordance with at least one of the group including (i) sequentially, (ii) in parallel, and (iii) a combination of sequentially and in parallel.

7. The memory system of claim 1, wherein the ECC decoding is performed in accordance with Reed Solomon (RS) codes.

8. The memory system of claim 1, wherein the first plurality of symbols includes at least four symbols.

9. The memory system of claim 3, wherein one portion of the received word includes data symbols and a remaining portion of the received word includes parity symbols.

10. The memory system of claim 9, wherein the controller includes an erasure pointer for storing a location of a detected erasure and supplying the location to a syndrome decoder.

11. The memory system of claim 9, wherein the controller includes a pointer for tracking which symbols where the erasure attempts have been performed.

12. The memory system of claim 10, wherein the detecting includes (i) identifying an error as an erasure and (ii) withholding supply of corresponding erasure location to the syndrome decoder.

13. The memory system of claim 3, wherein all of the remaining symbols from the plurality of portions are marked as erasures.

14. A method comprising:
performing, in a controller of a memory system including a plurality of memory components, error correction code (ECC) decoding on a received word read from the plurality of memory components
by (i) performing a single decoding attempt to detect one or more random errors in a portion of the received word, the portion corresponding to one memory component within the plurality of memory components, and correct the detected random errors; and (ii) when the correcting of the detected random errors fails, iteratively performing decoding attempts with each attempt marking symbols in the remaining portions of the received word that correspond respectively to remaining memory components of the plurality of memory components, as erasures, and using counter logic to obtain erasure location information corresponding to the erasures.

15. The method of claim 14, wherein marking at least one of the remaining symbols as an erasure facilitates correcting symbols in all the remaining memory components within the plurality of memory components; and
wherein the correcting includes (i) incrementing from a first memory component to each of the remaining components within the plurality of memory components and (ii) performing the ECC check on all the symbols on each of the remaining memory components.

16. The method of claim 15, wherein the plurality of memory components includes dynamic random access memory (DRAM) devices.

17. The method of claim 16, wherein the memory system is constructed in accordance compute express link (CXL) principles.

18. The method of claim 15, wherein the ECC decoding is performed in each of the remaining memory components in accordance with at least one of the group including substantially sequentially and substantially in parallel.

19. The method of claim 16, wherein the ECC decoding is performed in accordance with Reed Solomon (RS) codes.

20. The method of claim 15, wherein the first plurality of symbols includes at least four symbols.

21. A non-transitory computer readable medium having stored thereon computer executable instructions that, if executed by a computing device, cause the computing device to perform a method for use by a memory controller of a memory system including a plurality of memory components, the method comprising:
performing, in a controller of a memory system including a plurality of memory components, error correction code (ECC) decoding on a received word read from the plurality of memory components
by (i) performing a single decoding attempt to detect one or more random errors in a portion of the received word, the portion corresponding to one memory component within the plurality of memory components, and correct the detected random errors; and (ii) when the correcting of the detected random errors fails, iteratively performing decoding attempts with each attempt marking symbols in the remaining portions of the received word that correspond respectively to remaining memory components of the plurality of memory components, as erasures, and using counter logic to obtain erasure location information corresponding to the erasures.

\* \* \* \* \*